United States Patent
Lee et al.

(10) Patent No.: US 10,418,273 B2
(45) Date of Patent: Sep. 17, 2019

(54) METHOD OF MANUFACTURING A GERMANIUM-ON-INSULATOR SUBSTRATE

(71) Applicants: Nanyang Technological University, Singapore (SG); Massachusetts Institute of Technology, Cambridge, MA (US)

(72) Inventors: Kwang Hong Lee, Singapore (SG); Chuan Seng Tan, Singapore (SG); Eugene A. Fitzgerald, Cambridge, MA (US); Shuyu Bao, Singapore (SG); Yiding Lin, Singapore (SG); Jurgen Michel, Cambridge, MA (US)

(73) Assignees: Nanyang Technological University, Singapore (SG); Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/767,235

(22) PCT Filed: Oct. 11, 2016

(86) PCT No.: PCT/SG2016/050500
§ 371 (c)(1),
(2) Date: Apr. 10, 2018

(87) PCT Pub. No.: WO2017/065692
PCT Pub. Date: Apr. 20, 2017

(65) Prior Publication Data
US 2019/0074214 A1     Mar. 7, 2019

Related U.S. Application Data

(60) Provisional application No. 62/284,943, filed on Oct. 13, 2015.

(51) Int. Cl.
*H01L 21/762* (2006.01)
*H01L 31/105* (2006.01)

(52) U.S. Cl.
CPC .. *H01L 21/76254* (2013.01); *H01L 21/76251* (2013.01); *H01L 31/105* (2013.01)

(58) Field of Classification Search
None
See application file for complete search history.

(56) References Cited

U.S. PATENT DOCUMENTS 5,906,951 A * 5/1999 Chu ................ H01L 21/02381
                                                      438/751
6,521,041 B2 * 2/2003 Wu ..................... H01L 21/2007
                                                      117/915

(Continued)

FOREIGN PATENT DOCUMENTS

WO     2015178857 A1     11/2015

OTHER PUBLICATIONS

C. Gunn, "CMOS Photonics for high-speed interconnects", IEEE Micro, Mar.-Apr. 2006, pp. 58-66.

(Continued)

*Primary Examiner* — David E Graybill
(74) *Attorney, Agent, or Firm* — Lerner, David, Littenberg, Krumholz & Mentlik, LLP

(57) ABSTRACT

A method of manufacturing a germanium-on-insulator substrate is disclosed, comprising: (i) doping a first portion of a germanium layer with a first dopant to form a first electrode, the germanium layer arranged with a first semiconductor substrate; (ii) forming at least one layer of dielectric material adjacent to the first electrode to obtain a combined substrate; (iii) bonding a second semiconductor substrate to the layer of dielectric material and removing the first semiconductor substrate from the combined substrate to (Continued)

expose a second portion of the germanium layer with misfit dislocations; (iv) removing the second portion of the germanium layer to enable removal of the misfit dislocations and to expose a third portion of the germanium layer; and (v) doping the third portion of the germanium layer with a second dopant to form a second electrode. The electrodes are separated from each other by the germanium layer, and the first dopant is different to the second dopant.

27 Claims, 12 Drawing Sheets

(56) References Cited

U.S. PATENT DOCUMENTS

| | | | |
|---|---|---|---|
| 6,573,126 B2* | 6/2003 | Cheng | H01L 21/02381 257/E21.125 |
| 6,689,211 B1* | 2/2004 | Wu | H01L 21/30608 117/915 |
| 6,703,144 B2* | 3/2004 | Fitzgerald | C30B 25/02 117/953 |
| 6,852,652 B1* | 2/2005 | Maa | H01L 21/76254 257/E21.568 |
| 6,881,650 B2* | 4/2005 | Lee | H01L 21/76254 257/E21.568 |
| 6,921,914 B2* | 7/2005 | Cheng | H01L 21/02381 257/19 |
| 6,927,147 B2* | 8/2005 | Fitzgerald | H01L 21/2007 257/E21.568 |
| 6,995,430 B2* | 2/2006 | Langdo | H01L 21/28518 257/352 |
| 7,074,623 B2* | 7/2006 | Lochtefeld | H01L 21/76254 257/E21.415 |
| 7,074,686 B2* | 7/2006 | Bedell | H01L 21/02378 257/E21.129 |
| 7,084,460 B2* | 8/2006 | Chen | H01L 21/76254 257/347 |
| 7,109,516 B2* | 9/2006 | Langdo | H01L 21/76254 257/18 |
| 7,227,176 B2* | 6/2007 | Wu | H01L 21/02381 257/18 |
| 7,250,359 B2* | 7/2007 | Fitzgerald | H01L 21/02381 257/E21.125 |
| 7,259,108 B2* | 8/2007 | Fitzgerald | C30B 25/02 438/767 |
| 7,259,388 B2* | 8/2007 | Langdo | H01L 21/28518 257/18 |
| 7,279,369 B2* | 10/2007 | Lei | H01L 21/76254 257/E21.092 |
| 7,297,612 B2* | 11/2007 | Langdo | H01L 21/28518 438/458 |
| 7,348,259 B2* | 3/2008 | Cheng | H01L 21/30608 257/E21.122 |
| 7,414,259 B2* | 8/2008 | Langdo | H01L 21/28518 257/18 |
| 7,420,201 B2* | 9/2008 | Langdo | H01L 21/28518 257/18 |
| 7,427,773 B2* | 9/2008 | Chu | H01L 21/76256 257/19 |
| 7,510,904 B2 | 3/2009 | Chu et al. | |
| 7,588,994 B2* | 9/2009 | Langdo | H01L 21/28518 438/406 |
| 7,682,952 B2* | 3/2010 | Isaacson | H01L 21/0237 438/493 |
| 7,767,541 B2* | 8/2010 | Cheng | H01L 21/76251 257/E21.122 |
| 7,786,468 B2* | 8/2010 | Chu | H01L 21/76256 257/19 |
| 7,838,392 B2* | 11/2010 | Langdo | H01L 21/28518 438/459 |
| 7,855,127 B2* | 12/2010 | Akiyama | H01L 21/76254 257/55 |
| 7,884,353 B2* | 2/2011 | Currie | H01L 29/105 257/19 |
| 8,367,521 B2* | 2/2013 | Daval | H01L 21/30604 257/625 |
| 8,748,292 B2* | 6/2014 | Langdo | H01L 29/78687 438/459 |
| 8,877,608 B2* | 11/2014 | Di | H01L 21/76254 438/458 |
| 9,048,289 B2* | 6/2015 | Harper | H01L 21/76254 |
| 9,214,353 B2* | 12/2015 | Yonehara | H01L 21/304 |
| 9,419,031 B1* | 8/2016 | Or-Bach | H01L 31/0725 |
| 9,472,535 B2* | 10/2016 | Lagally | H01L 25/167 |
| 9,536,736 B2* | 1/2017 | Bedell | H01L 21/02532 |
| 9,692,209 B2* | 6/2017 | Bessette | H01L 21/0237 |
| 10,049,916 B2* | 8/2018 | Lee | H01L 21/76256 |
| 2001/0003269 A1* | 6/2001 | Wu | H01L 21/2007 117/94 |
| 2002/0072130 A1* | 6/2002 | Cheng | H01L 21/02381 438/10 |
| 2002/0084000 A1* | 7/2002 | Fitzgerald | H01L 21/02381 148/33.2 |
| 2003/0119280 A1* | 6/2003 | Lee | H01L 21/76254 438/459 |
| 2003/0186073 A1* | 10/2003 | Fitzgerald | C30B 25/02 428/641 |
| 2004/0000268 A1* | 1/2004 | Wu | H01L 21/02381 117/94 |
| 2004/0005740 A1* | 1/2004 | Lochtefeld | H01L 21/28518 438/149 |
| 2004/0031979 A1* | 2/2004 | Lochtefeld | H01L 21/76254 257/233 |
| 2004/0072409 A1* | 4/2004 | Fitzgerald | H01L 21/2007 438/455 |
| 2004/0173791 A1* | 9/2004 | Cheng | H01L 21/02381 257/19 |
| 2004/0185638 A1 | 9/2004 | Kakizaki et al. | |
| 2004/0192069 A1* | 9/2004 | Bedell | H01L 21/02378 438/778 |
| 2005/0042842 A1* | 2/2005 | Lei | H01L 21/76254 438/459 |
| 2005/0054168 A1* | 3/2005 | Currie | H01L 29/105 438/300 |
| 2005/0093100 A1* | 5/2005 | Chen | H01L 21/76254 257/616 |
| 2005/0136624 A1* | 6/2005 | Cheng | H01L 21/30608 438/478 |
| 2005/0156246 A1* | 7/2005 | Lochtefeld | H01L 29/78687 257/347 |
| 2005/0189563 A1* | 9/2005 | Lochtefeld | H01L 21/28518 257/192 |
| 2005/0199954 A1* | 9/2005 | Lochtefeld | H01L 21/28518 257/347 |
| 2005/0205934 A1* | 9/2005 | Lochtefeld | H01L 21/28518 257/347 |
| 2005/0212061 A1* | 9/2005 | Langdo | H01L 21/28518 257/397 |
| 2005/0218453 A1* | 10/2005 | Langdo | H01L 21/28518 257/352 |
| 2005/0280103 A1* | 12/2005 | Langdo | H01L 21/76254 257/401 |
| 2006/0113542 A1* | 6/2006 | Isaacson | H01L 21/0237 257/65 |
| 2006/0148225 A1* | 7/2006 | Fitzgerald | C30B 25/02 438/578 |
| 2007/0054474 A1* | 3/2007 | Tracy | H01L 21/02381 438/479 |
| 2007/0093036 A1* | 4/2007 | Cheng | H01L 21/76245 438/458 |
| 2007/0170541 A1* | 7/2007 | Chui | H01L 21/28255 257/506 |
| 2007/0218597 A1* | 9/2007 | Bedell | H01L 29/1054 438/142 |
| 2008/0128751 A1* | 6/2008 | Langdo | H01L 21/28518 257/191 |
| 2008/0194078 A1* | 8/2008 | Akiyama | H01L 21/76254 438/458 |

(56) References Cited

U.S. PATENT DOCUMENTS

| | | | | |
|---|---|---|---|---|
| 2011/0303273 | A1* | 12/2011 | Harper | H01L 31/0687 136/255 |
| 2011/0303291 | A1* | 12/2011 | Harper | H01L 21/76254 136/261 |
| 2014/0004684 | A1* | 1/2014 | Di | H01L 21/76254 438/458 |
| 2014/0038392 | A1* | 2/2014 | Yonehara | H01L 21/304 438/463 |
| 2014/0254620 | A1* | 9/2014 | Bessette | H01L 21/0237 372/45.01 |
| 2015/0129911 | A1* | 5/2015 | Lagally | H01L 25/167 257/94 |
| 2016/0225618 | A1* | 8/2016 | Bedell | H01L 21/02532 |
| 2017/0271201 | A1* | 9/2017 | Lee | H01L 21/76256 |
| 2018/0277629 | A1* | 9/2018 | Lee | H01L 29/0684 |
| 2019/0074214 | A1* | 3/2019 | Lee | H01L 31/105 |

OTHER PUBLICATIONS

D. Suh, et al., "36-GHz High-Responsivity Ge Photodetectors Grown by RPCVD", IEEE Photonics Technology Letters, vol. 21, No. 10, May 2009, pp. 672-674.

H.-C. Luan et al., High-quality Ge epilayers on Si with low threading-dislocaiton densities, Applied Physics Letters, vol. 75, No. 19, Nov. 1999, pp. 2909-2911.

J. H. Nam et al., "Monolithic integration of germanium-on-insulator p-i-n photodetector on silicon.", Optics Express, vol. 23, No. 12, Jun. 2015, pp. 15816-15823.

J. Liu et al., "High-performance, tensile-strained Ge p-i-n photodetectors on a Si platform", Applied Physics Letters, vol. 87, Aug. 2005, pp. 1035011-1035013.

J. M. Hartmann et al., "Reduced pressure-chemical vapor deposition of Ge thick layers on Si(001) for 1.3-1.55 μm photodetection", Journal of Applied Physics, vol. 95, No. 10, May 2004, pp. 5905-5913.

K. Wada et al., "On-chip Interconnection Beyond Semiconductor Roadmap—Silicon Microphotonics—", Proceedings of SPIE, vol. 4870, Jul. 2002, pp. 365-371.

L. C. Kimerling et al., "Electronic-photonic integrated circuits on the CMOS platform", Proceedings of SPIE, vol. 6125, Feb. 2006.

L. Colace et al., "Efficient high-speed near-infrared Ge photodetectors integrated on Si substrates", Applied Physics Letters, vol. 76, No. 10, Mar. 2000, pp. 1231-1233.

L. Colace et al., "Ge on Si p-i-n photodiodes operating at 10 Gbit/s", Applied Physics Letters, vol. 88, Mar. 2006, pp. 1011111-1011113.

L. Colace et al., "Metal-semiconductor-metal near infrared light detector based on epitaxial Ge/Si", Applied Physics Letters, vol. 72, No. 24, Jun. 1998, pp. 3175-3177.

M. Takenaka et al., "Dark current reduction of Ge photodetector by GeO2 surface passivation and gas-phase doping", Optics Express, vol. 20, No. 8, Apr. 2012, pp. 8719-8725.

R. Soref, "The Past, Present, and Future of Silicon Photonics", IEEE Journal of Selected Topics in Quantum Electronics, vol. 12, No. 6, Nov./Dec. 2006, pp. 1678-1687.

S. Fama et al., "High performance germanium-on-silicon detectors for optical communications", Applied Physics Letters, vol. 81, No. 4, Jul. 2002, pp. 586-588.

International Search Report for Application No. PCT/SG2016/050500 dated Jan. 20, 2017.

K.H. Lee et al., "Defects Reduction of Ge Epitaxial Film in a Germanium-on-Insulator Wafer by Annealing in Oxygen Ambient." APL Materials 3, 16102, Jan. 2015.

* cited by examiner

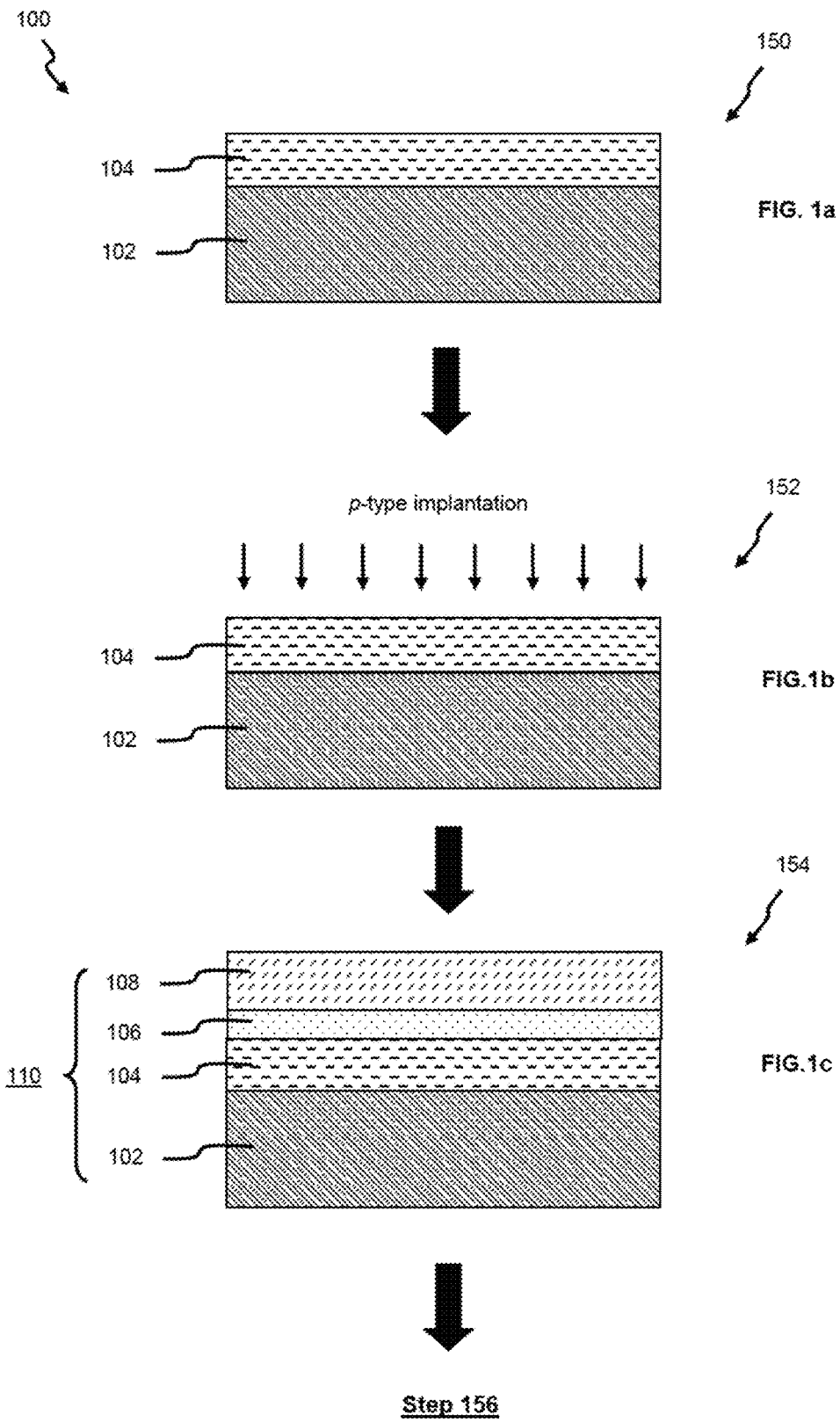

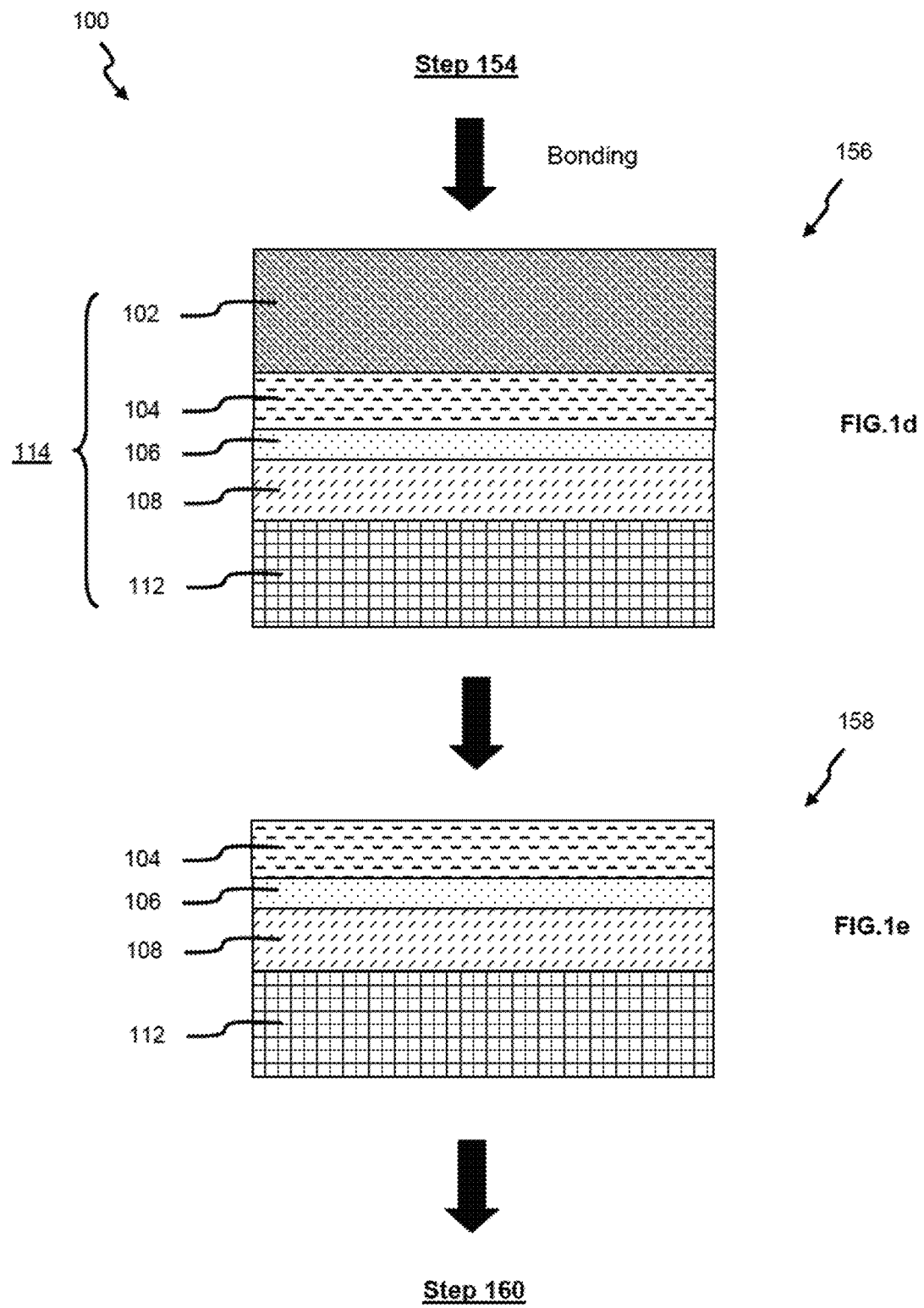

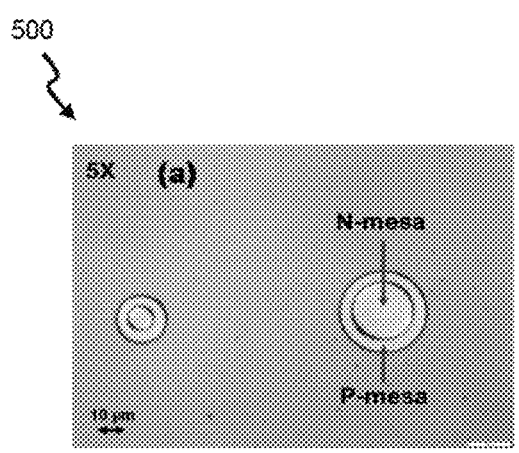
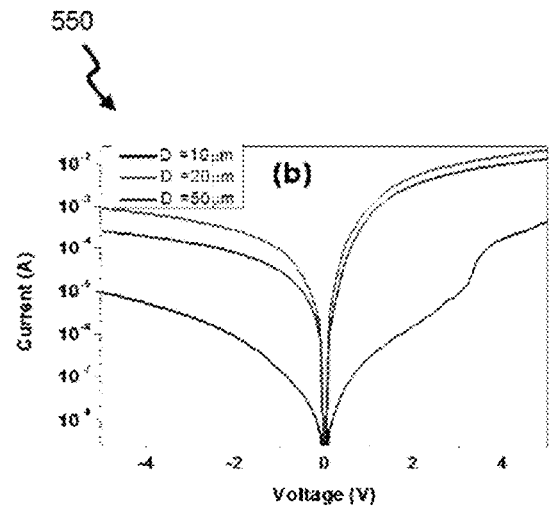
FIG. 5a      FIG. 5b
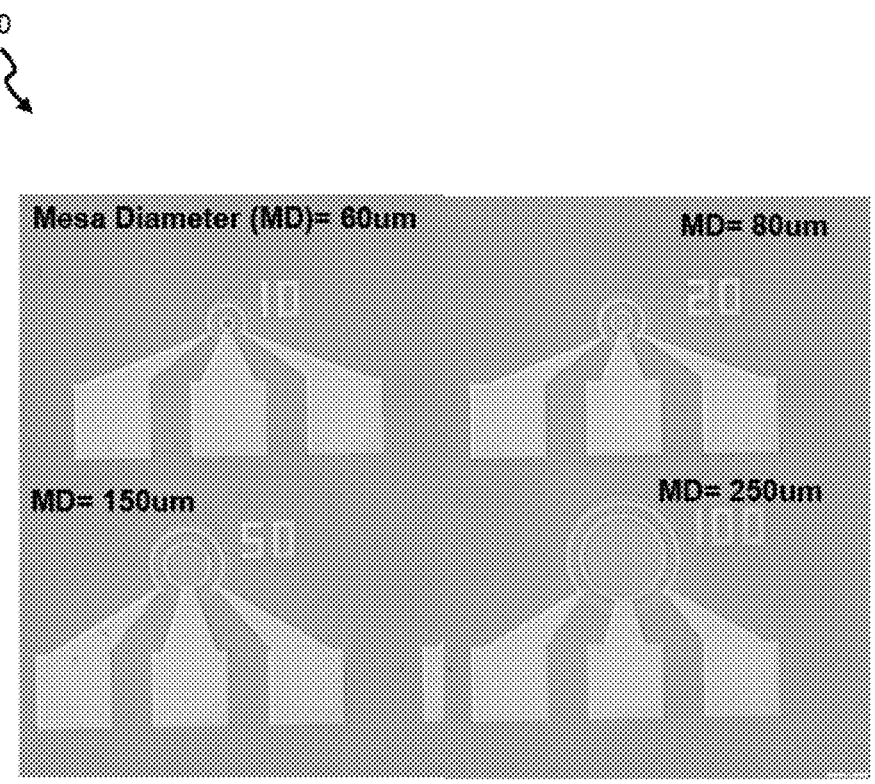
FIG. 6

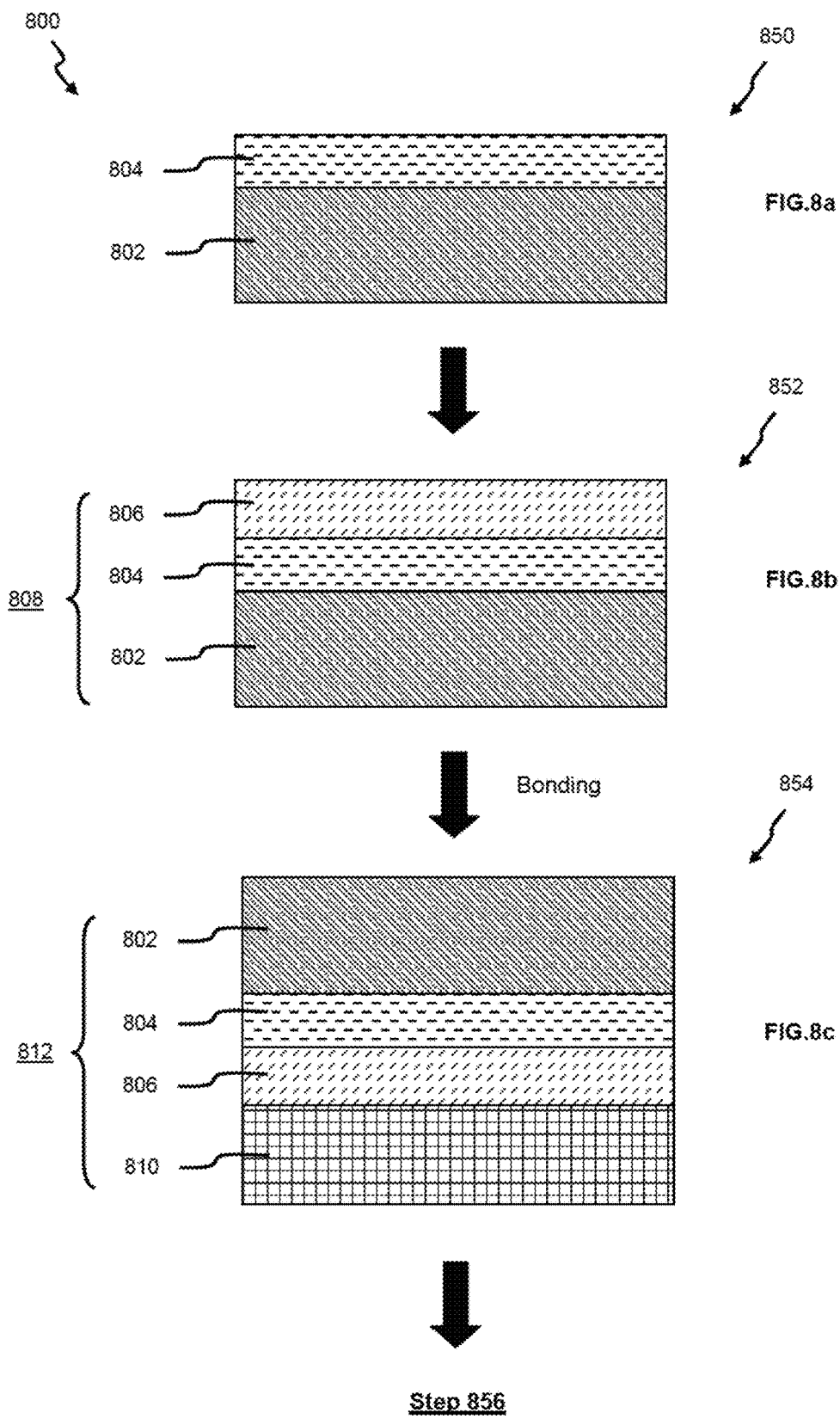

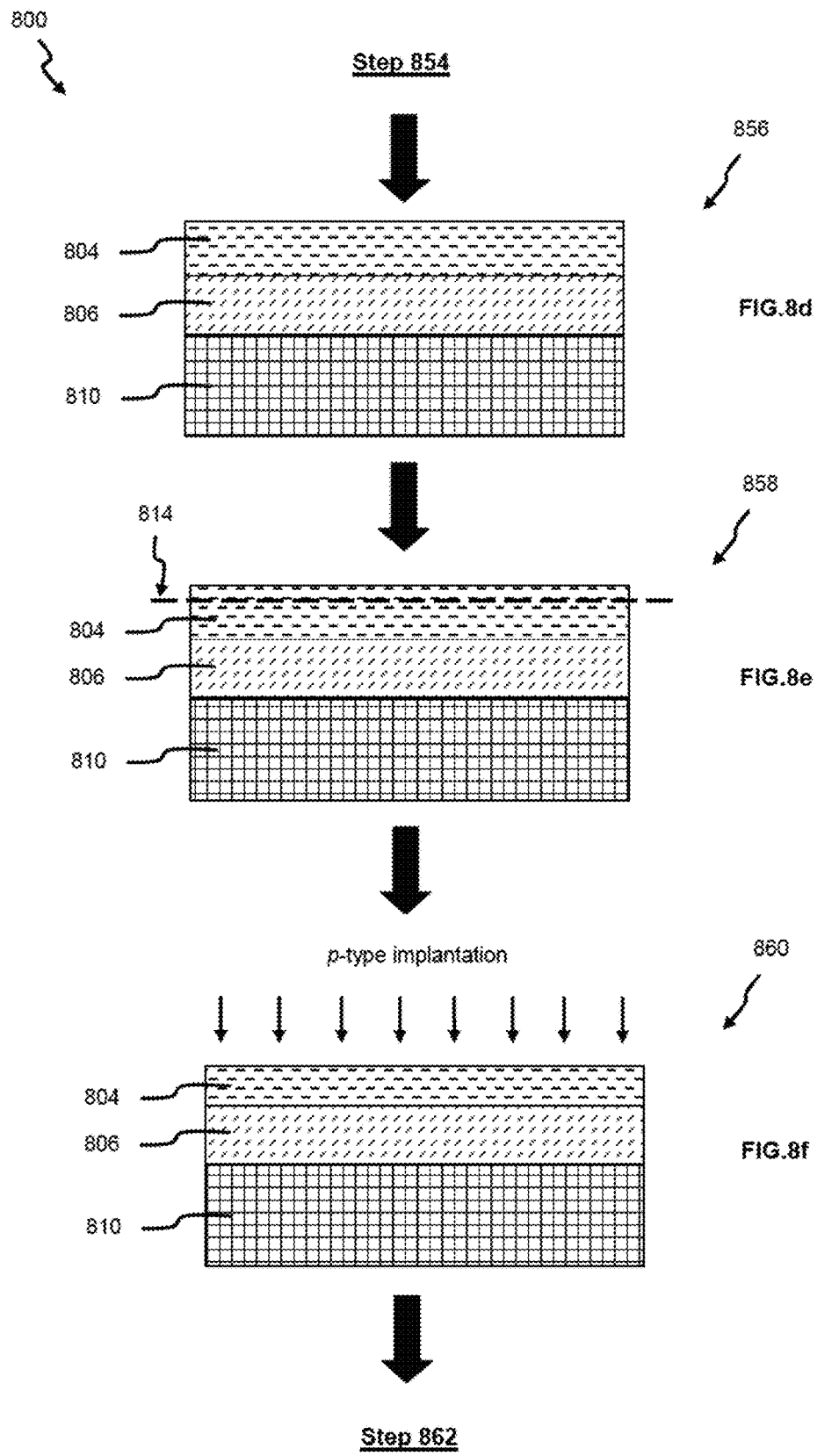

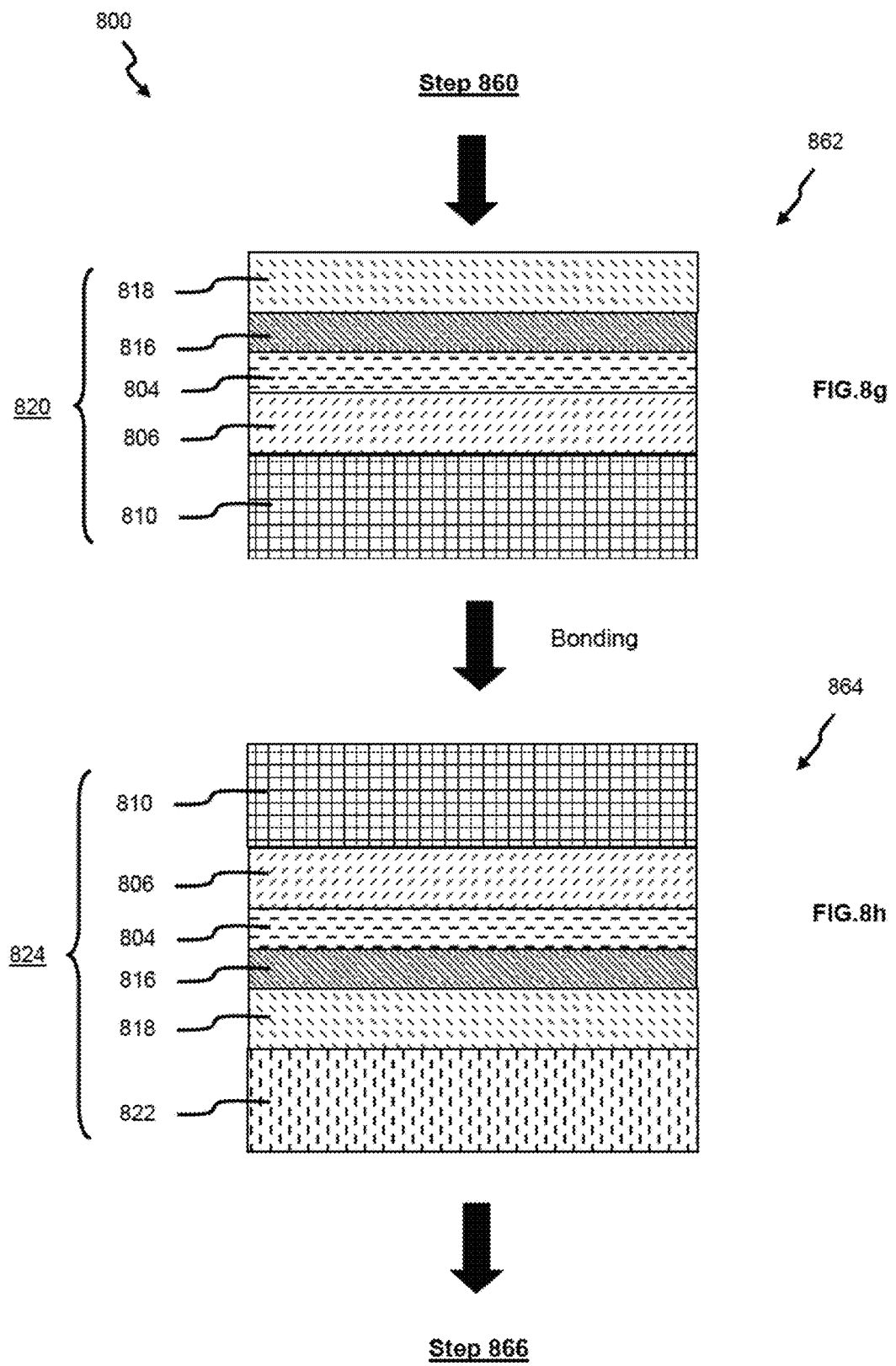

METHOD OF MANUFACTURING A GERMANIUM-ON-INSULATOR SUBSTRATE

CROSS REFERENCE TO RELATED APPLICATIONS

The present application is a national phase entry under 35 U.S.C. § 371 of International Application No. PCT/SG2016/050500 filed on Oct. 11, 2016, which claims priority from U.S. Patent Application No. 62/284,943 filed on Oct. 13, 2015, all of which are hereby incorporated herein by reference.

FIELD

The present invention relates to a method of manufacturing a germanium-on-insulator substrate.

BACKGROUND

Silicon (Si) photonics has become increasingly important in recent years, as Si is deemed to have great potential for augmenting the performance roadmap known as Moore's Law. As the short distance data transmissions rate approaches 10 Gb/s, usage of conventional copper interconnections has encountered challenges, such as increased power consumption, electro-magnetic interference, signal cross-talk, and heavier weight, which relegated usage of copper interconnections as an inferior approach for high bandwidth applications. To keep up with the ever need in up-scaling of bandwidth for interconnects, optical signal delivery is preferred (over electrical signal delivery) due to its high bandwidth and extremely low power consumption. Over the past decades, conventional optical components (for optical signal delivery) tend to be produced from III-V compound semiconductors, e.g. gallium arsenide (GaAs) or indium phosphide (InP), due to their excellent light emission and absorption properties. Unfortunately, compound semiconductor devices are generally too complicated to manufacture and costlier to implement in optical interconnects.

As a result, combining sophisticated processing techniques, with benefits in production costs and mass production ability, Si photonic has emerged as one of the most promising solutions for implementing the next generation of interconnections. However, the wavelength normally used for the majority of long-distance data transmission is in the 1.3 µm-1.55 µm range corresponding to the lowest loss window of the silica optical fiber. Beneficially, if the same said wavelength is utilized in future short-distance data transmissions including inter-chip, chip-to-chip and fiber-to-home communications, end users are then able to connect directly to external servers on the Internet, without need for wavelength conversion (typically performed bi-directionally for short-distance to long-distance data transmissions), thus enabling global communications to be much cheaper and easier. Although Si photo-detectors have been widely used in optical receivers in the wavelength range of 850 nm, its relatively large bandgap of 1.12 eV (corresponding to an absorption cutoff wavelength of about 1.1 µm) however hinders adoption of Si photo-detectors in the longer wavelength range of 1.3 µm-1.55 µm range. For a more seamless integration, a material with strong absorption coefficients in the 1.3 µm-1.55 µm range is thus desired.

Germanium (Ge), a Group IV material in the same group as Si, has attracted growing interest for realization of high performance photo-detectors due to its favourable absorption coefficient in the widely used telecommunication wavelength. However, Ge can be a challenging material to integrate in a CMOS environment due to its low thermal budget constraint, and its large lattice mismatch of around 4.2% with Si. Consequently, high defect densities in the Ge-on-Si epitaxial film may induce unfavourable carrier recombination that would degrade the detector quantum efficiency. In addition, in the case of p-i-n Ge photo-detectors, the diffusion of the p-type and n-type dopants into the intrinsic Ge also tends to be unavoidable during the Ge growth, resulting in unintentional doping of the intrinsic Ge region, which leads to unwanted degradation in electrical and optical properties of the p-i-n Ge photo-detectors.

One object of the present invention is therefore to address at least one of the problems of the prior art and/or to provide a choice that is useful in the art.

SUMMARY

According to a $1^{st}$ aspect, there is provided a method of manufacturing a germanium-on-insulator substrate, comprising: (i) doping a first portion of a germanium layer with a first dopant to form a first electrode, the germanium layer arranged with a first semiconductor substrate; (ii) forming at least one layer of dielectric material adjacent to the first electrode to obtain a combined substrate; (iii) bonding a second semiconductor substrate to the layer of dielectric material and removing the first semiconductor substrate from the combined substrate to expose a second portion of the germanium layer with misfit dislocations; (iv) removing the second portion of the germanium layer to enable removal of the misfit dislocations and to expose a third portion of the germanium layer; and (v) doping the third portion of the germanium layer with a second dopant to form a second electrode. The electrodes are separated from each other by the germanium layer, and the first dopant is different to the second dopant.

Beneficially, the proposed method enables a way to form high-quality and high-purity Ge structure, which then may be used as a base platform to fabricate p-i-n Ge photo-detectors, or other complex devices. Also, the method provides a direct way to remove a defective top portion of the germanium layer (with growth defects), consequently improving a significant reduction in dark current of the resulting p-i-n Ge photo-detectors fabricated on this basis.

Preferably, subsequent to step (ii) and prior to step (iii), the method may further comprise inverting the combined substrate.

Preferably, the first dopant may be a group III semiconductor material and the second dopant may be a group V semiconductor material. Accordingly, the first electrode is a p-type electrode and the second electrode is an n-type electrode.

Alternatively, the first dopant may instead be a group V semiconductor material and the second dopant may be a group III semiconductor material. Then, the first electrode is an n-type electrode and the second electrode is a p-type electrode.

Preferably, removing the first semiconductor substrate from the combined substrate at step (iii) may include using a combination of mechanical grinding and wet-etching in a solution of tetramethylammonium hydroxide for the removal.

Preferably, removing the second portion at step (iv) may include using annealing or chemical mechanical planarization for the removal.

Also, the annealing may preferably be performed using a gas selected from the group consisting of oxygen, hydrogen, nitrogen, forming gas and argon.

Preferably, forming the at least one layer of dielectric material may include forming a plurality of layers of different dielectric materials.

Preferably, the dielectric material may be selected from the group consisting of aluminium oxide, aluminium nitrate, silicon dioxide, synthetic diamond, silicon nitride and boron nitride.

Preferably, the first and second semiconductor substrates may respectively be formed from a silicon-based material.

Preferably, forming the at least one layer of dielectric material may include using plasma-enhanced chemical vapour deposition or atomic layer deposition to deposit the dielectric material.

Preferably, subsequent to step (ii) and prior to step (iii), the method may further comprise: (vi) performing densification on the combined substrate to degas the layer of dielectric material.

More specifically, the densification may be performed at about between 300° C. to 900° C. in a nitrogen environment.

Preferably, subsequent to step (vi), the method may further comprise using chemical mechanical planarization to smoothen a portion of the dielectric material.

Prior to the bonding, the method may further comprise: performing plasma cleaning on the combined substrate and second semiconductor substrate; washing the cleaned combined substrate and second semiconductor substrate with a deionized fluid; and drying the washed combined substrate and second semiconductor substrate.

The deionized fluid may be deionized water.

Then, drying the washed combined substrate and second semiconductor substrate may preferably include using spin-drying.

Preferably, bonding the second semiconductor substrate to the layer of dielectric material may further include annealing the combined substrate at step (iii) to increase the bonding between the second semiconductor substrate and the layer of dielectric material.

Preferably, the annealing may be performed using nitrogen at a temperature of about 300° C. and at atmosphere pressure.

Preferably, the plasma cleaning may be performed with oxygen plasma, hydrogen plasma, argon plasma, or nitrogen plasma.

According to a $2^{nd}$ aspect, there is provided a method of manufacturing a germanium-on-insulator substrate, comprising: (i) forming a first layer of dielectric material on a germanium layer to obtain a first combined substrate, the germanium layer arranged with a first semiconductor substrate; (ii) bonding a second semiconductor substrate to the first layer of dielectric material and removing the first semiconductor substrate from the first combined substrate to expose a first portion of the germanium layer with misfit dislocations; (iii) removing the first portion of the germanium layer to enable removal of the misfit dislocations and to expose a second portion of the germanium layer; (iv) doping the second portion of the germanium layer with a first dopant to form a first electrode; (v) forming at least one layer of the dielectric material adjacent to the first electrode to obtain a second combined substrate; (vi) bonding a third semiconductor substrate to the at least one layer of the dielectric material, and removing the second semiconductor substrate and first layer of dielectric material from the second combined substrate to expose a third portion of the germanium layer; and (vii) doping the third portion of the germanium layer with a second dopant to form a second electrode. The electrodes are separated from each other by the germanium layer, and the first dopant is different to the second dopant.

Preferably, the first dopant may be a group III semiconductor material and the second dopant may be a group V semiconductor material. Accordingly, the first electrode is a p-type electrode and the second electrode is an n-type electrode.

Conversely, the first dopant may instead be a group V semiconductor material and the second dopant may be a group III semiconductor material. Then, the first electrode is an n-type electrode and the second electrode is a p-type electrode.

Preferably, removing the first semiconductor substrate from the first combined substrate at step (ii) may include using a combination of mechanical grinding and wet-etching in a solution of tetramethylammonium hydroxide for the removal.

Preferably, removing the first portion at step (iii) may include using annealing or chemical mechanical planarization for the removal.

Further, the annealing may be performed using a gas selected from the group consisting of oxygen, hydrogen, nitrogen, forming gas and argon.

Preferably, forming the at least one layer of dielectric material may include forming a plurality of layers of different dielectric materials.

Preferably, the dielectric material may be selected from the group consisting of aluminium oxide, aluminium nitrate, silicon dioxide, synthetic diamond, silicon nitride and boron nitride.

Preferably, the first, second and third semiconductor substrates may respectively be formed from a silicon-based material.

Preferably, forming the layer of dielectric material may include using plasma-enhanced chemical vapour deposition or atomic layer deposition to deposit the dielectric material.

Preferably, subsequent to step (v) and prior to step (vi), the method may further comprise: (viii) performing densification on the combined substrate to degas the at least one layer of the dielectric material.

The densification may be performed at about between 300° C. to 900° C. in a nitrogen environment.

Preferably, subsequent to step (viii), the method may further comprise using chemical mechanical planarization to smoothen a portion of the dielectric material.

Preferably, bonding the third semiconductor substrate to the at least one layer of the dielectric material may further include annealing the second combined substrate at step (vi) to increase the bonding between the third semiconductor substrate and the at least one layer of the dielectric material.

Preferably, the annealing may be performed using nitrogen at a temperature of about 300° C. and at atmosphere pressure.

Preferably, subsequent to step (i) and prior to step (ii), the method may further comprise inverting the first combined substrate.

Preferably, subsequent to step (v) and prior to step (vi), the method may further comprise inverting the second combined substrate.

According to a $3^{rd}$ aspect, there is provided a germanium-on-insulator substrate comprising: a germanium layer arranged on a semiconductor substrate; at least one layer of dielectric material arranged intermediate the germanium layer and semiconductor substrate; and first and second electrodes formed respectively from first and second portions of the germanium layer by doping the first and second portions respectively with first and second dopants. The electrodes are separated from each other by the germanium layer, and the first dopant is different to the second dopant.

Preferably, the first dopant may be a group III semiconductor material and the second dopant may be a group V semiconductor material. Accordingly, the first electrode is a p-type electrode and the second electrode is an n-type electrode.

In the alternative, the first dopant may instead be a group V semiconductor material and the second dopant may be a group III semiconductor material. Then, the first electrode is an n-type electrode and the second electrode is a p-type electrode. Preferably, the semiconductor substrate may be formed from a silicon-based material.

Preferably, the at least one layer of dielectric material may include a plurality of layers of different dielectric materials.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIGS. 1a to 1g collectively depict a method of manufacturing a germanium-on-insulator (GOI) substrate, according to a first embodiment;

FIG. 5a is a microscopic image of the mesa structures of the p-i-n Ge photo-detector of FIG. 4, and FIG. 5b is a graph showing I-V characteristics of the said mesa structures, on basis of different mesa diameters;

FIG. 6 shows an optical microscopic image of various p-i-n Ge photo-detectors, with different mesa diameters, fabricated on a GOI substrate obtained using the method of the first embodiment;

FIGS. 8a to 8j collectively depict a method of manufacturing a germanium-on-insulator (GOI) substrate, according to a second embodiment.

DETAILED DESCRIPTION OF PREFERRED EMBODIMENTS

Figure 1F:
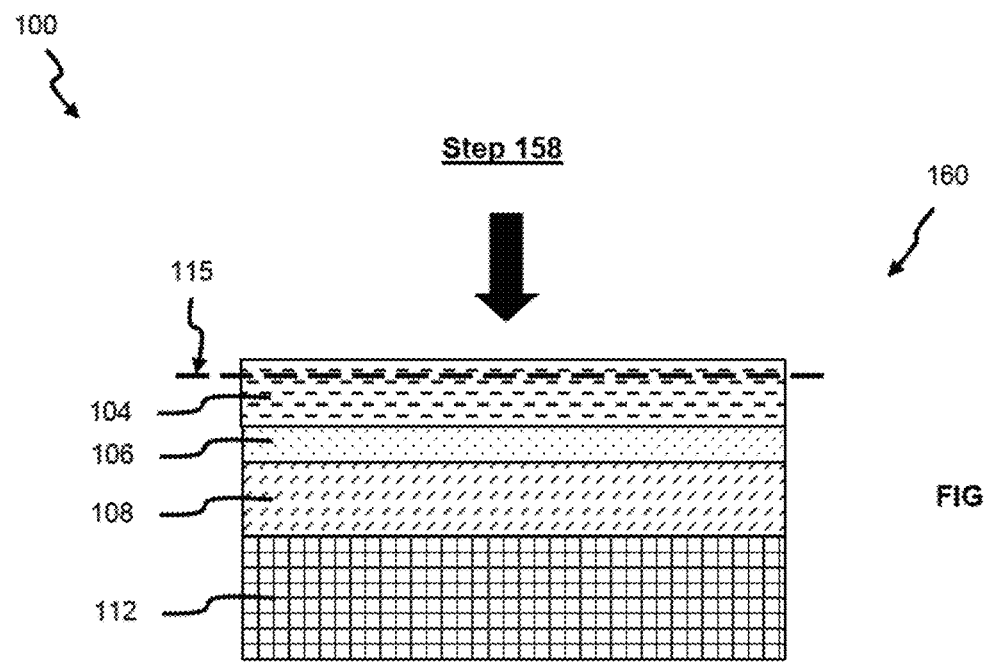

FIGS. 1a to 1g depict (steps of) a method 100 of manufacturing a germanium-on-insulator (GOI) substrate 180, according to a first embodiment. At step 150 (i.e. FIG. 1a), a first semiconductor substrate 102 arranged with an intrinsic germanium (Ge) epi-layer 104 thereon is provided. In particular, a three-step Ge growth is used to grow the Ge layer 104 (with possible low background doping from the reactor used) directly on the first semiconductor substrate 102, but the three-step Ge growth is not the focus of this application, and so will not be elaborated herein. Next, at step 152 (i.e. FIG. 1b), a first portion of the Ge layer 104 is doped with a first dopant (not shown) to form a first electrode 106. In this case, the first portion of the Ge layer 104 is the top surface of the Ge layer 104, which is arranged in opposition to the bottom surface of the Ge layer 104 in contact with the first semiconductor substrate 102.

At further step 154 (i.e. FIG. 1c), at least one layer of dielectric material 108 is formed adjacent to the first electrode 106 to obtain a first combined substrate 110. The layer of dielectric material 108 is formed using, for example, plasma-enhanced chemical vapour deposition (PECVD) or atomic layer deposition to deposit the dielectric material onto the first electrode 106. To also explain, the definition of the at least one layer of dielectric material 108 in this embodiment means a single layer of dielectric material 108 (e.g. around 100-300 nm thick), but in variant embodiments, it is possible that a plurality of layers of different dielectric materials may be formed too, if desired. The dielectric material to be used is selected from the group consisting of aluminium oxide ($Al_2O_3$), aluminium nitrate (AlN), silicon dioxide ($SiO_2$), synthetic diamond, silicon nitride ($Si_3N_4$) and boron nitride (BN). The layer of dielectric material 108 serves as a capping layer for planarization process as well as a bonding interface subsequently, to be explained below.

At this stage, from a top-down perspective, the first combined substrate 110 is configured with the following layers: the layer of dielectric material 108, the first electrode 106, the Ge layer 104, and the first semiconductor substrate 102. Then the first combined substrate 110 is vertically inverted, so that the sequence of the layers of the first combined substrate 110 described in the preceding sentence is now reversed, from the top-down perspective—see FIG. 1d.

Thereafter (and prior to step 156), densification may optionally be performed on the first combined substrate 110 to degas the layer of dielectric material 108 to degas any residual by-products or gas molecules that may be incorporated in the layer of dielectric material 108 during its formation. If the layer of dielectric material 108 used is $SiO_2$, then the densification is carried out at about 450° C. in a nitrogen environment for about seven hours. It is also to be appreciated that densification may also be performed at about between 300° C. to 900° C., depending on other factors (e.g. type of dielectric material 108 adopted) in different situations. Once densification is completed, chemical mechanical planarization (CMP) is then used to smoothen a top portion of the layer of dielectric material 108 that has oxidized as a result of the densification.

At step 156 (i.e. FIG. 1d), a second semiconductor substrate 112 is bonded to the layer of dielectric material 108, which now forms the bottom of the first combined substrate 110 (due to the inversion), to provide a second combined substrate 114. The layer of dielectric material 108 provides a bonding interface between the first combined substrate 110, and the second semiconductor substrate 112. It is to be appreciated that both the first and second semiconductor substrates 102, 112 are respectively formed from a silicon-based material. In this case, the first and second semiconductor substrates 102, 112 are formed from silicon (Si), and also, the first and second semiconductor substrates 102, 112 may respectively be termed a Si carrier wafer, and a Si substrate. After bonding, the second combined substrate 114 is annealed to further increase/enhance the bonding strength between the second semiconductor substrate 112 and the layer of dielectric material 108. In particular, the annealing is performed (for about three hours) using nitrogen at a temperature of about 300° C. and at ambient atmosphere pressure.

Then, at step 158 (i.e. FIG. 1e), the first semiconductor substrate 102 is removed from the second combined substrate 114 to expose a second portion of the Ge layer 104 that has misfit dislocations (or other growth defects). More specifically, the first semiconductor substrate 102 is removed from the second combined substrate 114 by using a combination of mechanical grinding and wet-etching in a solution of tetramethylammonium hydroxide (TMAH) heated to about 80° C. for the removal. It is to be appreciated that during the removal, the Ge layer 104 also functions as an etch-stop layer. Then to clarify, the second portion of the Ge layer 104 is actually the bottom surface of the Ge layer 104 that was previously in contact with the first semiconductor substrate 102 (prior to removal), as depicted in FIG. 1b. That is, the second portion is the surface that interfaces the first semiconductor substrate 102 and Ge layer 104, and was not previously accessible at steps 150-154.

It is also to be highlighted that optionally, after the densification and prior to step 156, plasma cleaning (e.g. using oxygen plasma, hydrogen plasma, argon plasma, or nitrogen plasma) may be performed on the first combined substrate 110 and second semiconductor substrate 112 for about 15 seconds each, followed by washing the cleaned first combined substrate 110 and second semiconductor substrate 112 with a deionized fluid (e.g. deionized water), and finally drying (e.g. spin-drying) the washed first combined substrate 110 and second semiconductor substrate 112. These additional steps are taken to prepare the first combined substrate 110 and second semiconductor substrate 112 for the bonding at step 156.

At step 160 (i.e. FIG. 1f, the second portion of the Ge layer 104 is removed (as indicated by a horizontal dotted line 115 in FIG. 1f) to enable removal/repair of the misfit dislocations, which consequently exposes a third portion of the Ge layer 104. Removal of the second portion at step 160 may be achieved using (for example) annealing or chemical mechanical planarization (CMP). If annealing is utilised, the annealing may be performed at a suitable temperature for example at about 920° C., and using a suitable gas such as oxygen ($O_2$), hydrogen ($H_2$), nitrogen ($N_2$), forming gas, or argon (Ar) for the annealing environment. It is to be appreciated that 920° C. is just below the melting point of Ge. In this regard, PCT publication: PCT/SG2015/050121, discloses that if annealing is performed on a Ge film with growth defects, the threading dislocation density (TDD) can advantageously be reduced by at least two orders of magnitude to around low-$10^6$/cm$^2$ after the annealing is completed. Separately, if boron (B) is used as the first dopant, boron diffusion into the intrinsic Ge epi-layer 104 also needs to be carefully monitored after the annealing, despite it is known that boron has relatively lower diffusivity in Ge.

Once completed, at step 162 (i.e. FIG. 1g), the third portion of the Ge layer 104 is doped with a second dopant (not shown) to form a second electrode 116 to obtain the GOI substrate 180. For avoidance of doubt, it is to be appreciated that for the proposed method 100, only described steps 152-162 are required as a bare minimum; the other steps are either optional or need not be performed as part of the method 100.

It is also to be highlighted that the method 100 is devised preferably for a thermal budget not exceeding 450° C. to form the GOI substrate 180.

Structurally, the GOI substrate 180 broadly comprises: the Ge layer 104 arranged on the second semiconductor substrate 112; at least one layer of dielectric material 108 arranged intermediate the Ge layer 104 and second semiconductor substrate 112; and first and second electrodes 106, 116 formed respectively from the first and second portions of the Ge layer 104 by doping the first and second portions respectively with the first and second dopants. The electrodes 106, 116 are arranged in opposition to each other, and the second electrode 116 is configured at the top of the GOI substrate 180, while the first electrode 106 is embedded between the Ge layer 104 and the layer of dielectric material 108.

It is to be appreciated that the first and second electrodes 106, 116 are physically separated from each other 106, 116 by the Ge layer 104 (that is not subjected to any explicit doping as part of the method 100, although intrinsic diffusion of the first and/or second dopants from the doped first and/or second portions of the Ge layer 104 is possible), and also the first dopant is different to the second dopant (based on chemical grouping in the periodic table, i.e. chemically different). In this case, the first dopant is a group III semiconductor material (e.g. boron (B), or gallium (Ga)) and the second dopant is a group V semiconductor material (e.g. phosphorus (P), arsenic (As), or antimony (Sb)). In other words, the first dopant is a p-type dopant and the second dopant is an n-type dopant. Accordingly, the first electrode 106 is formed as a p-type electrode, while the second electrode 116 is formed as an n-type electrode. Hence, the GOI substrate 180 obtained at step 162 is a p-i-n GOI substrate.

Figure 1G:
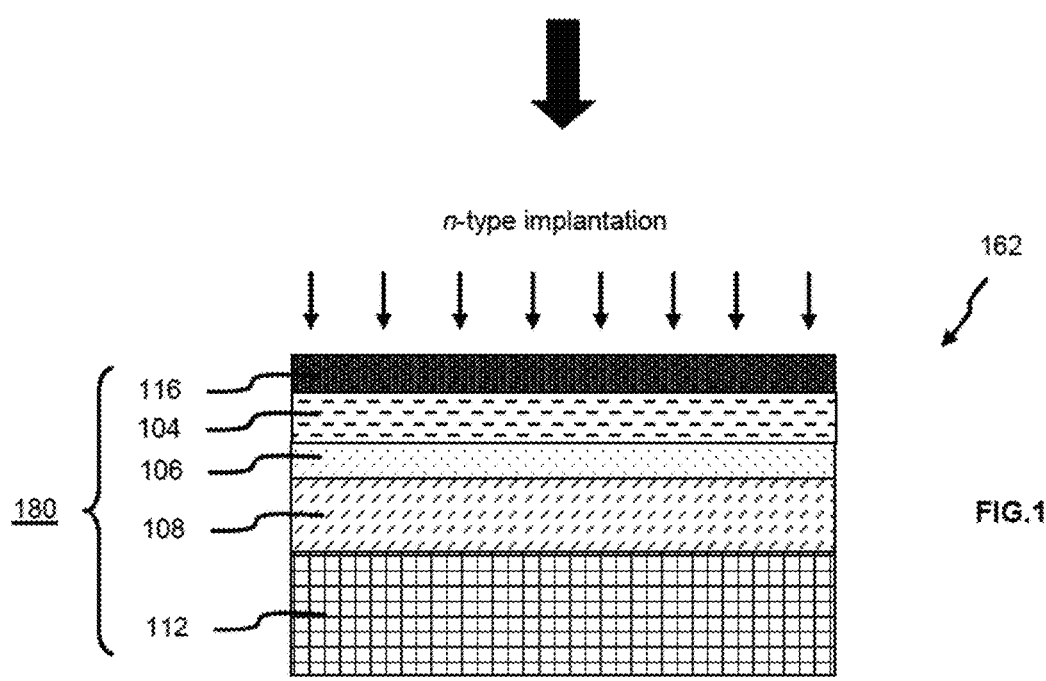

Further, for avoidance of doubt, in actual samples, the thickness of the Ge layer 104 in FIG. 1a is the same as the total combined thickness of the first electrode 106, the second electrode 116, and the Ge layer 104 in FIG. 1g (since the first and second electrodes 106, 116 shown in FIGS. 1b to 1g are formed from respective portions of the Ge layer 104, as already explained above). That is, the thicknesses of the different layers shown in FIGS. 1a to 1g are not to be construed as being representative of dimensions of the corresponding layers in actual samples that may be manufactured via the method 100, and have been drawn exaggerated simply for sake of illustration clarity.

Figure 2:
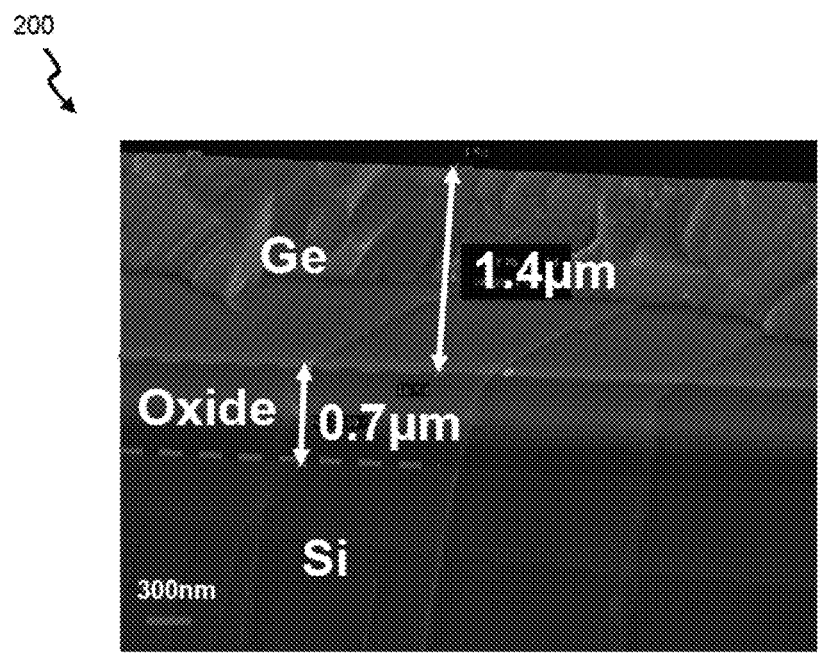
FIG. 2 is a cross-sectional SEM image of a sample of the GOI substrate obtained using the method of the first embodiment.
Figure 3:
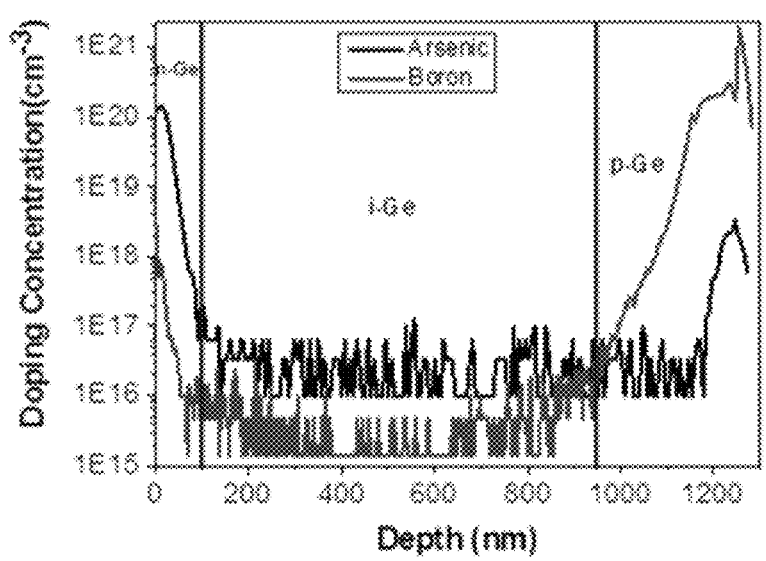
FIG. 3 is a graph of SIMS analysis performed on the Ge layer of the GOI substrate of FIG. 2 to investigate respective doping concentrations of arsenic and boron, used to dope portions of the Ge layer to form respective electrodes, versus a function of depth of the Ge layer.

FIG. 2 shows a cross-sectional SEM image 200 of a sample of the GOI substrate 180 obtained using the proposed method 100, where it is clearly observed that substantially void-free GOI structure is achieved via the direct bonding step. FIG. 3 depicts a graph 300 of SIMS analysis performed on the Ge layer 104 of the GOI substrate 180 (as manufactured), to investigate respective doping concentrations of boron (used as the first dopant) and arsenic (used as the second dopant), adopted for doping respective portions of the Ge layer 104 to form the first and second electrodes 106, 116, versus a function of depth of the Ge layer 104. Indeed, the SIMS analysis shows that the n-type and p-type layer ion implantation conditions have been optimized (i.e. the dopant profile is well-controlled), in accordance as proposed by the disclosed method 100.

Figure 4:
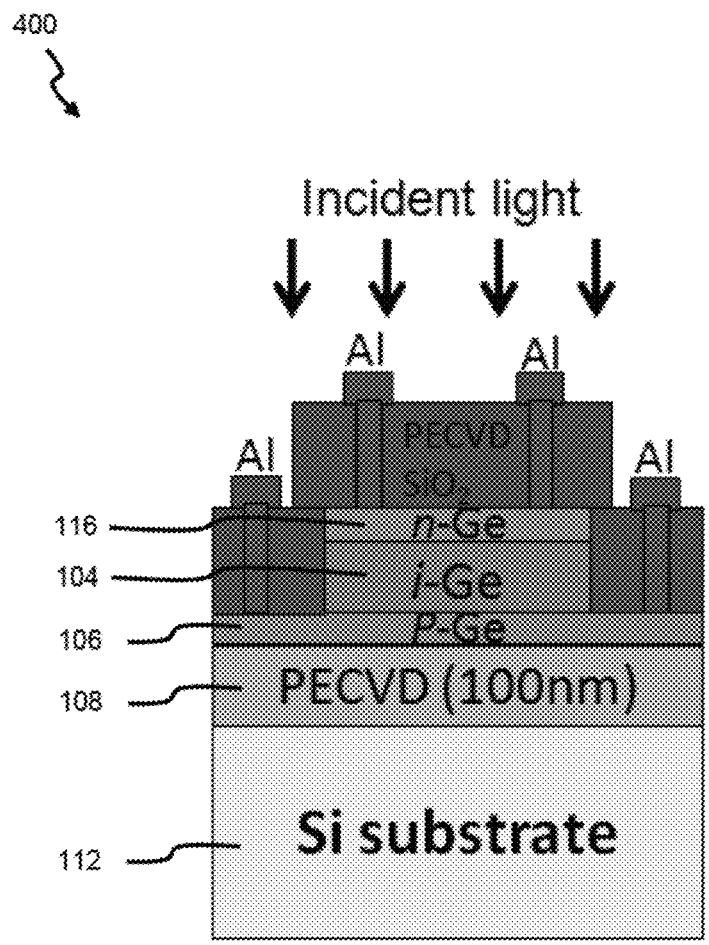
FIG. 4 shows a cross-sectional schematic view of a p-i-n Ge photo-detector fabricated on the basis of the GOI substrate obtained using the method of the first embodiment.

FIG. 4 shows a cross-sectional schematic view of an exemplary p-i-n Ge photo-detector 400 fabricated using the GOI substrate 180 obtained by the proposed method 100.

Briefly, to fabricate the p-i-n Ge photo-detector 400, mesa structures are first defined on the GOI substrate 180 by photolithography, and the GOI substrate 180 is then dry etched using a reactive ion etching (RIE) tool. The etching is performed through the first electrode 106 (i.e. the top n-Ge layer) and the Ge layer 104 (i.e. the sandwiched i-Ge layer), but otherwise stopped at the second electrode 116 (i.e. the bottom p-Ge layer). A layer of $SiO_2$ is then deposited via PECVD on the processed GOI substrate 180, and the layer of PECVD $SiO_2$ provides insulation, passivation and anti-reflection purposes. Subsequently, necessary openings for electrical contacts are patterned in the layer of PECVD $SiO_2$ and followed by dry/wet etching the layer of PECVD $SiO_2$. Next, aluminium (Al) is deposited (e.g. by e-beam evaporation or sputtering) on the layer of PECVD $SiO_2$ (as processed), patterned and etched to form the top and bottom metal contacts as well as metallization to finally realise the p-i-n Ge photo-detector 400.

FIG. 5a is a microscopic image 500 of the mesa structures of the p-i-n Ge photo-detector 400 of FIG. 4, and FIG. 5b is a graph 550 showing measured I-V characteristics of the said mesa structures (in FIG. 5a), but fabricated with different mesa diameters (i.e. 60 µm, 80 µm, 150 µm and 250 µm) and investigated accordingly. Indeed, the I-V probing test reveals clear diode I-V characteristics, as shown in FIG. 5b. It is to be appreciated that the high dark current in FIG. 5b could be attributed to lack of surface passivation layer on the mesa structures. Compared with the prior art, the result depicted in FIG. 5b show immense potential for future novel photo-detection applications using GOI substrates.

FIG. 6 shows an optical microscopic image 600 of various p-i-n Ge photo-detectors, with different mesa diameters (i.e. 60 µm, 80 µm, 150 µm, and 250 µm), fabricated on the GOI substrate 180 made by the disclosed method 100. Particularly, the optical microscopic image 600 depicts clear device surface features of the respective p-i-n Ge photo-detectors.

Figure 7A:
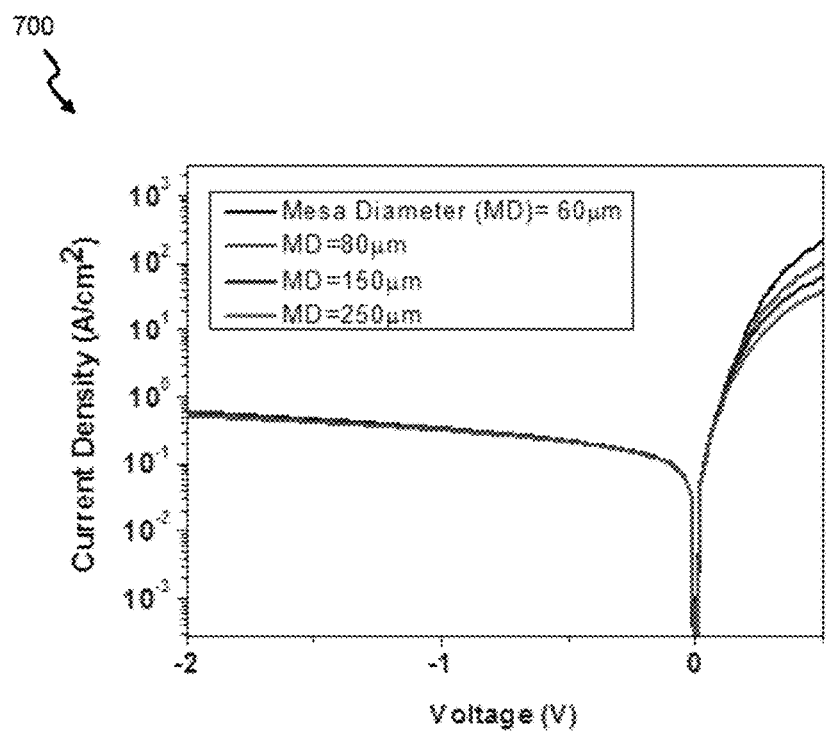
FIG. 7a is a graph showing current density versus voltage characteristics of the mesa structures of the p-i-n Ge photo-detectors of FIG. 6.
Figure 7B:
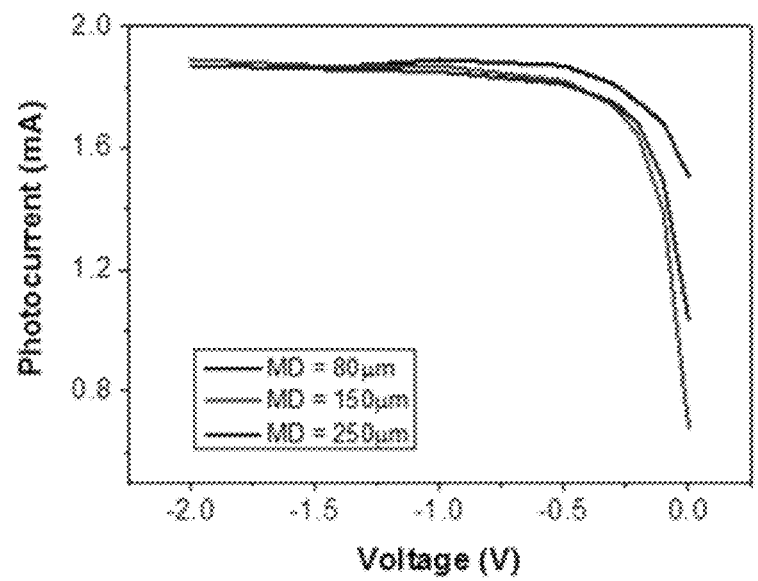
FIG. 7b is a graph showing photocurrent versus voltage characteristics of the mesa structures of the p-i-n Ge photo-detectors of FIG. 6.
Figure 7C:
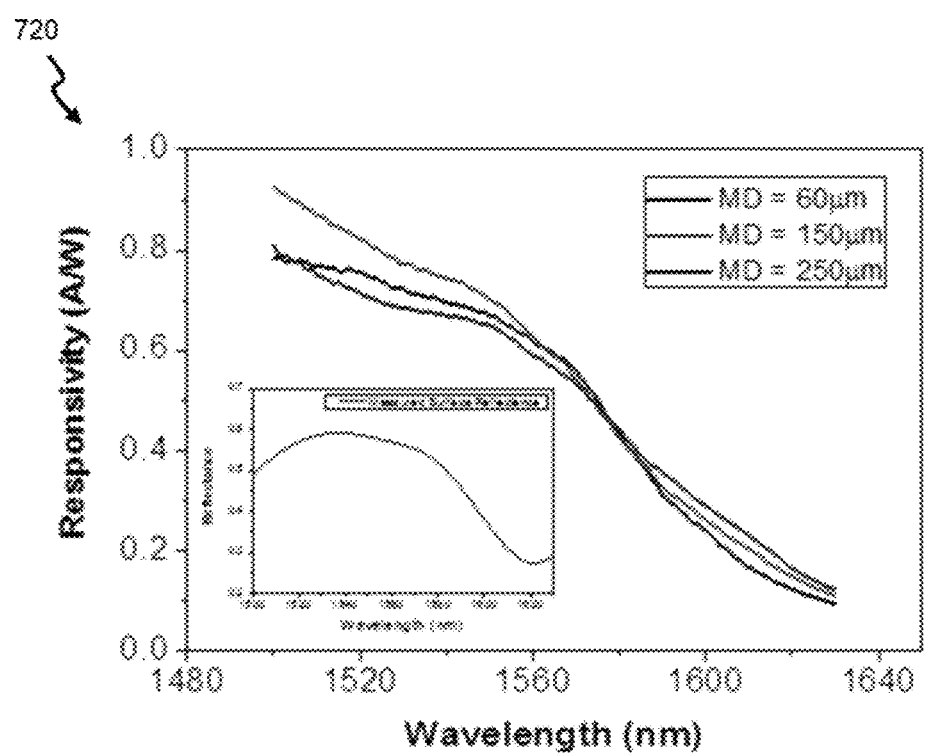
FIG. 7c is a graph showing responsivity versus wavelength characteristics of the mesa structures of the p-i-n Ge photo-detectors of FIG. 6.

On basis of different configured mesa diameters (i.e. 60 µm, 80 µm, 150 µm, and 250 µm), FIG. 7a is a graph 700 showing current density versus voltage characteristics of the mesa structures of the p-i-n Ge photo-detectors of FIG. 6, in which a dark current density of $5 \times 10^{-1}$ A/cm$^2$ is measured at −2 V. It is to be appreciated that dark current is independent of mesa diameters, thus indicating minimal device peripheral surface current leakage of the p-i-n Ge photo-detectors. Then, FIG. 7b is a graph 710 showing photocurrent versus voltage characteristics of the mesa structures of the p-i-n Ge photo-detectors of FIG. 6, in which it is observed that photocurrent saturates at low reverse bias of 0.5 V, enabling the p-i-n Ge photo-detectors to achieve low power operation. FIG. 7c is a graph 720 showing responsivity versus wavelength characteristics of the mesa structures of the p-i-n Ge photo-detectors of FIG. 6, in which device responsivity of 0.65 A/W is measured at 1550 nm (at −2 V bias).

The remaining configurations/embodiments will be described hereinafter. For the sake of brevity, description of like elements, functionalities and operations that are common between the different configurations/embodiments are not repeated; reference will instead be made to similar parts of the relevant configuration(s)/embodiment(s).

According to a second embodiment, FIGS. 8a to 8j depict a variant method 800 of manufacturing the GOI substrate 180 (of the first embodiment). But in this embodiment, the reference numeral 828 is instead used for the GOI substrate 828 to differentiate from that in the first embodiment, simply for ease of understanding to avoid confusion. To begin, at step 850 (i.e. FIG. 8a), a first semiconductor substrate 802 arranged with an intrinsic germanium (Ge) epi-layer 804 thereon is provided. Similarly, the three-step Ge growth (as set out in the first embodiment) is used to grow the Ge layer 804. At next step 852 (i.e. FIG. 8b), a first layer of dielectric material 806 is formed on the Ge layer 804 to obtain a first combined substrate 808. The first layer of dielectric material 806 is formed using (for example) PECVD or atomic layer deposition, and the dielectric material used may be $Al_2O_3$, AlN, $SiO_2$, synthetic diamond, $Si_3N_4$ or BN. At this point, from a top-down perspective, the first combined substrate 808 is configured with the following layers: the first layer of dielectric material 806, the Ge layer 804, and the first semiconductor substrate 802. Then the first combined substrate 808 is vertically inverted, so that the sequence of the layers of the first combined substrate 808 described in the preceding sentence is now reversed, from the top-down perspective—see FIG. 8c.

At step 854 (i.e. FIG. 8c), the inverted first combined substrate 808 is then bonded to a second semiconductor substrate 810 (to form a second combined substrate 812) by bonding the first layer of dielectric material 806 to the second semiconductor substrate 810. Thereafter, at step 856 (i.e. FIG. 8d), the first semiconductor substrate 802 is removed from the second combined substrate 812 to expose a first portion of the Ge layer 804 with misfit dislocations. The first portion is the surface of the Ge layer 804 interfacing the first semiconductor substrate 802 and Ge layer 804, at steps 850-854. Removal of the first semiconductor substrate 802 is done using a combination of mechanical grinding and wet-etching in a solution of TMAH heated to about 80° C. for the removal. At further step 858 (i.e. FIG. 8e), the first portion of the Ge layer 804 is removed (as indicated by a horizontal dotted line 814 in FIG. 8e) to enable removal/repair of the misfit dislocations, which consequently exposes a second portion of the Ge layer 804. Removing the first portion at step 858 may be done using (for example) annealing or CMP. If annealing is utilised, the annealing may be performed at a suitable temperature such as at about 920° C., and using a suitable gas like $O_2$, $H_2$, $N_2$, forming gas, or Ar for the annealing environment. The annealing improves the TDD of the Ge layer 804.

At step 860 (i.e. FIG. 8f), the second portion of the Ge layer 804 is doped with a first dopant (not shown) to form a first electrode 816. Once completed, at least one layer of the dielectric material 818 is formed adjacent to the first electrode 816 at step 862 (i.e. FIG. 8g) to obtain a third combined substrate 820. Similarly, the least one layer of the dielectric material 818 may be formed using PECVD or atomic layer deposition. The definition of the at least one layer of dielectric material 818 in this embodiment is the same as set out in the first embodiment, but does not preclude forming multiple layers of different dielectric materials, if needed. The dielectric material used may be $Al_2O_3$, AlN, $SiO_2$, synthetic diamond, $Si_3N_4$ or BN.

From a top-down perspective, the third combined substrate 820 is arranged with the following layers: the at least one layer of the dielectric material 818, the first electrode 816, the Ge layer 804, the first layer of dielectric material 806, and the second semiconductor substrate 810. Before taking step 864 below, the third combined substrate 820 is vertically inverted, so that the sequence of the layers of the third combined substrate 820 is now vertically reversed, from the top-down perspective—see FIG. 8h.

Prior to step 864, densification may also optionally be performed on the third combined substrate 820 (before/after the inversion) to degas the at least one layer of dielectric material 818 of any residual by-products or gas molecules that may be incorporated in the said layer 818 during its formation. If the at least one layer of dielectric material 818 is formed out of SiO$_2$, then the densification is carried out at about 450° C. in a N$_2$ environment for about seven hours. But similarly, it is also to be appreciated that densification may also be performed at about between 300° C. to 900° C., depending on other factors (e.g. type of dielectric material 108 adopted) in different situations. Once densification is completed, CMP is used to smoothen a top portion of the at least one layer of dielectric material 818 that has oxidized due to the densification.

Subsequently, at step 864 (i.e. FIG. 8h), the inverted third combined substrate 820 is bonded to a third semiconductor substrate 822 (to form a fourth combined substrate 824) by bonding the least one layer of the dielectric material 818 to the third semiconductor substrate 822. In a top-down order, the layers of the fourth combined substrate 824 are arranged as: the second semiconductor substrate 810, the first layer of dielectric material 806, the Ge layer 804, the first electrode 816, the at least one layer of dielectric material 818, and the third semiconductor substrate 822. After bonding, the fourth combined substrate 824 is annealed to further increase/enhance the bonding strength between the third semiconductor substrate 822 and the least one layer of the dielectric material 818. The annealing is performed (for about three hours) using nitrogen at a temperature of about 300° C. and at ambient atmosphere pressure. It is to be appreciated that the first, second and third semiconductor substrates 802, 810, 822 are respectively formed from a silicon-based material—in this case, silicon (Si). Also, the first, second and third semiconductor substrates 802, 810, 822 may respectively be termed a Si carrier wafer, a Si handle, and a Si substrate. Then, at step 866 (i.e. FIG. 8i), the second semiconductor substrate 810 and the first layer of dielectric material 806 are both removed from the fourth combined substrate 824 to expose a third portion of the Ge layer 804. Lastly, at step 868 (i.e. FIG. 8j), the third portion of the Ge layer 804 is doped with a second dopant (not shown) to form a second electrode 826 to obtain the GOI substrate 828. Needless to say, the structure of the GOI substrate 828 is structurally the same as that described in the first embodiment, as already mentioned above.

For the variant method 800, only described steps 852-868 are needed as a bare minimum; the other steps are either optional or may not be performed as part of the method 800. Further, the method 800 involves a twin inversion-bonding process occurring at steps 854 and 864.

It is to be appreciated that the first and second electrodes 816, 826 are physically separated from each other 816, 826 by the Ge layer 804, and also the first dopant is different to the second dopant (in terms of chemical grouping in the periodic table, i.e. chemically different). Again, the first dopant is a group III semiconductor material (e.g. boron (B), or gallium (Ga)) and the second dopant is a group V semiconductor material (e.g. phosphorus (P) or arsenic (As) or antimony (Sb)). So, the first dopant is a p-type dopant and the second dopant is an n-type dopant. Hence, the first electrode 816 is formed as a p-type electrode, while the second electrode 826 is formed as an n-type electrode. Accordingly, the GOI substrate 828 obtained at step 868 is also a p-i-n GOI substrate.

Figures 8I, 8J:
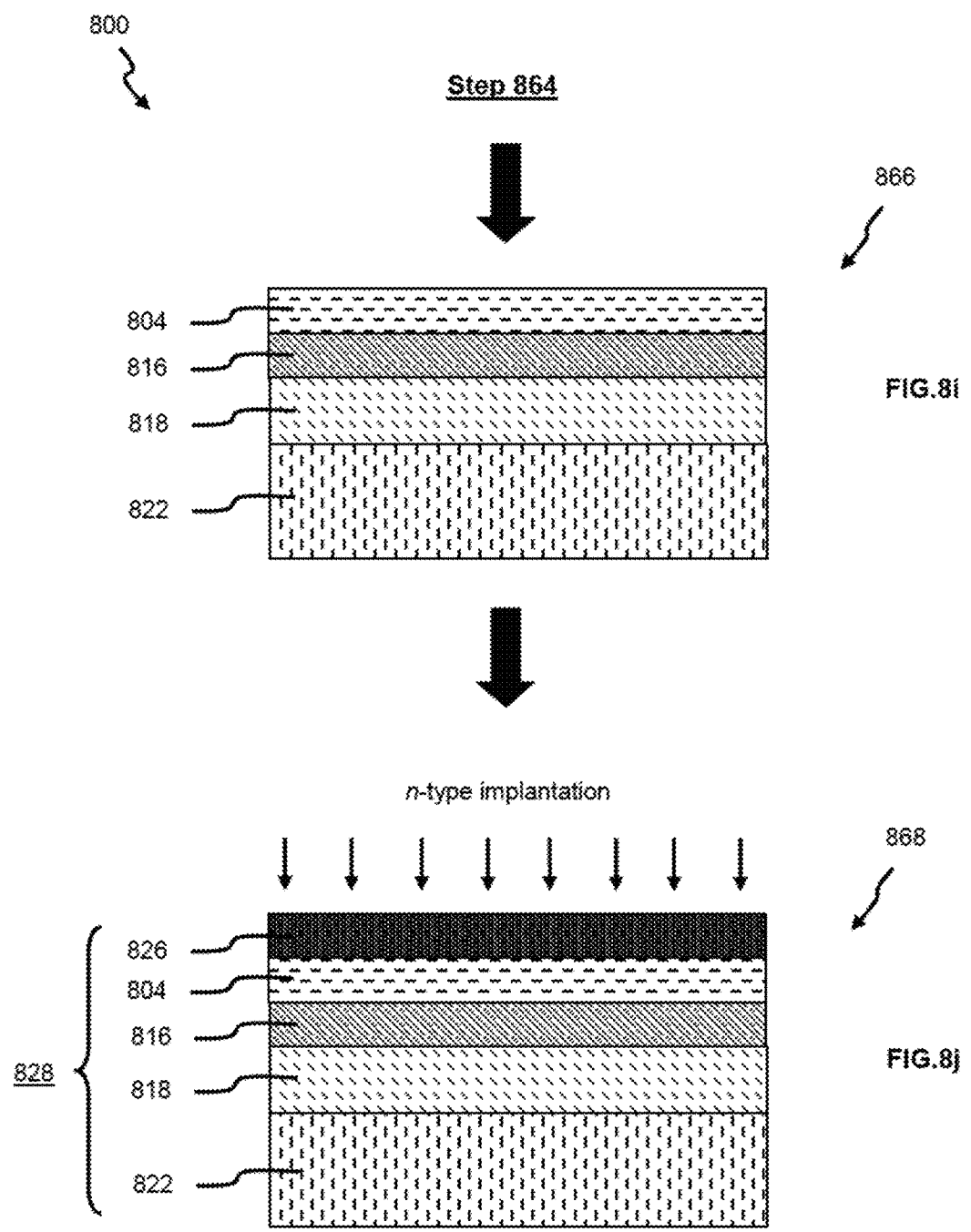

Also for avoidance of doubt, in actual samples, the thickness of the Ge layer 804 in FIG. 8a is the same as the total combined thickness of the first electrode 816, the second electrode 826 and the Ge layer 804 depicted in FIG. 8j (since the first and second electrodes 816, 826 shown in FIGS. 8g to 8j are formed from respective portions of the Ge layer 804, as afore described). That is, the thicknesses of the different layers shown in FIGS. 8a to 8j are not to be interpreted as representative of dimensions of those in actual samples that may be manufactured using the variant method 800, and have instead been drawn exaggerated for sake of illustration clarity.

In summary, the proposed method 100, 800 provides a way to form high-quality and high-purity Ge structure, which can subsequently be used to fabricate p-i-n Ge photo-detectors, or other suitable complex devices. With reference to implementing p-i-n Ge photo-detectors on this basis, it is to be appreciated that the photo-detector itself is arranged to be electrically isolated from the underlying Si substrate due to the on-insulator structure of the base GOI substrate 180, 828. Further, the method 100, 800 also beneficially provides a direct way to remove a defective part of the Ge layer 104 (having misfit dislocations/growth defects), which can then contribute to improving a significant reduction in dark current of implemented p-i-n Ge photo-detectors. To generally reiterate the method 100, 800, as afore described, a high quality intrinsic Ge epilayer is first directly grown on Si (for example), and followed by ex-situ implantation of the first dopant to form the first electrode 106, 816 (i.e. a p-type electrode). After that, bonding and layer transferring of the Ge film to form the GOI substrate 180, 828 are carried out. Finally, another ex-situ implantation of the second dopant is used to form the second electrode 116, 826 (i.e. an n-type electrode) to realize the p-i-n GOI substrate.

Further as a brief discussion, in conventional approaches, both p-type and n-type dopants may diffuse into the intrinsic Ge film easily during growth of Ge on Si, especially during a high temperature thermal cycling step (i.e. a step typically taken to reduce the defect density of the Ge film). Moreover, a Ge epitaxial film, highly doped with p-type and n-type dopants, tends to have a very rough surface, which consequently results in undesirable light scattering and affects the performance of p-i-n Ge photo-detectors fabricated on this basis. These challenges are however overcome and addressed by using ex-situ implantation process to form the p-type and n-type electrodes, as proposed in the disclosed method 100, 800. Specifically, the p-type and n-type doping are carried out only after the high quality and intrinsic Ge layer 104, 804 has been grown on the Si substrate. In addition, the GOI substrate 180, 828 manufactured by means of the proposed method 100, 800 has lower parasitic capacitance and lower leakage characteristics, compared to conventional ones.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

For example, in both embodiments, the first dopant may instead be a group V semiconductor material and the second dopant is then a group III semiconductor material. So, the first electrode 106 is now formed as an n-type electrode, whereas the second electrode 116 is formed as a p-type electrode. Hence, the GOI substrate 180 obtained at step 162 becomes an n-i-p GOI substrate. In addition, the layer of dielectric material 108, 818 (whether arranged as a single layer or a plurality of layers) may in some instances be configured to have light reflection function to further enhance performance of the Ge photo-detectors, if they are implemented on top of the GOI substrate 180, 828.

The invention claimed is:

1. A method of manufacturing a germanium-on-insulator substrate, comprising:
   (i) doping a first portion of a germanium layer with a first dopant to form a first electrode, the germanium layer arranged with a first semiconductor substrate;
   (ii) forming at least one layer of dielectric material adjacent to the first electrode to obtain a combined substrate;
   (iii) bonding a second semiconductor substrate to the at least one layer of dielectric material and removing the first semiconductor substrate from the combined substrate to expose a second portion of the germanium layer with misfit dislocations;
   (iv) removing the second portion of the germanium layer to enable removal of the misfit dislocations and to expose a third portion of the germanium layer; and
   (v) doping the third portion of the germanium layer with a second dopant to form a second electrode,
   wherein the electrodes are separated from each other by the germanium layer, and the first dopant is different to the second dopant.

2. The method of claim 1, wherein subsequent to step (ii) and prior to step (iii), further comprises at least one of:
   inverting the combined substrate-; and
   (vi) performing densification on the combined substrate to degas the at least one layer of dielectric material.

3. The method of claim 1, wherein removing the first semiconductor substrate from the combined substrate at step (iii) includes using a combination of mechanical grinding and wet-etching in a solution of tetramethylammonium hydroxide for the removal.

4. The method of claim 1, wherein removing the second portion at step (iv) includes using annealing or chemical mechanical planarization for the removal.

5. The method of claim 4, wherein the annealing is performed using a gas selected from the group consisting of oxygen, hydrogen, nitrogen, forming gas and argon.

6. The method of claim 1, wherein the dielectric material is selected from the group consisting of aluminium oxide, aluminium nitrate, silicon dioxide, synthetic diamond, silicon nitride and boron nitride.

7. The method of claim 1, wherein forming the at least one layer of dielectric material includes using plasma-enhanced chemical vapour deposition or atomic layer deposition to deposit the dielectric material.

8. The method of claim 2, wherein the densification is performed at about between 300° C. to 900° C. in a nitrogen environment.

9. The method of claim 2, wherein subsequent to step (vi), further comprises using chemical mechanical planarization to smoothen a portion of the dielectric material.

10. The method of claim 1, wherein prior to the bonding, further comprises:
    performing plasma cleaning on the combined substrate and second semiconductor substrate;
    washing the cleaned combined substrate and second semiconductor substrate with a deionized fluid; and
    drying the washed combined substrate and second semiconductor substrate.

11. The method of claim 10, wherein the deionized fluid is deionized water.

12. The method of claim 10, wherein drying the washed combined substrate and second semiconductor substrate includes using spin-drying.

13. The method of claim 1, wherein bonding the second semiconductor substrate to the at least one layer of dielectric material further includes annealing the combined substrate at step (iii) to increase the bonding between the second semiconductor substrate and the layer of dielectric material.

14. The method of claim 13, wherein the annealing is performed using nitrogen at a temperature of about 300° C. and at atmosphere pressure.

15. The method of claim 10, wherein the plasma cleaning is performed with oxygen plasma, hydrogen plasma, argon plasma, or nitrogen plasma.

16. A method of manufacturing a germanium-on-insulator substrate, comprising:
    (i) forming a first layer of dielectric material on a germanium layer to obtain a first combined substrate, the germanium layer arranged with a first semiconductor substrate;
    (ii) bonding a second semiconductor substrate to the first layer of dielectric material and removing the first semiconductor substrate from the first combined substrate to expose a first portion of the germanium layer with misfit dislocations;
    (iii) removing the first portion of the germanium layer to enable removal of the misfit dislocations and to expose a second portion of the germanium layer;
    (iv) doping the second portion of the germanium layer with a first dopant to form a first electrode;
    (v) forming at least one layer of the dielectric material adjacent to the first electrode to obtain a second combined substrate;
    (vi) bonding a third semiconductor substrate to the at least one layer of the dielectric material, and removing the second semiconductor substrate and the first layer of dielectric material from the second combined substrate to expose a third portion of the germanium layer; and
    (vii) doping the third portion of the germanium layer with a second dopant to form a second electrode,
    wherein the electrodes are separated from each other by the germanium layer, and the first dopant is different to the second dopant.

17. The method of claim 16, wherein removing the first semiconductor substrate from the first combined substrate at step (ii) includes using a combination of mechanical grinding and wet-etching in a solution of tetramethylammonium hydroxide for the removal.

18. The method of claim 16, wherein removing the first portion at step (iii) includes using annealing or chemical mechanical planarization for the removal.

19. The method of claim 18, wherein the annealing is performed using a gas selected from the group consisting of oxygen, hydrogen, nitrogen, forming gas, and argon.

20. The method of claim 16, wherein the dielectric material is selected from the group consisting of aluminium oxide, aluminium nitrate, silicon dioxide, synthetic diamond, silicon nitride and boron nitride.

21. The method of claim 16, wherein forming the first layer of dielectric material or the at least one layer of dielectric material includes using plasma-enhanced chemical vapour deposition or atomic layer deposition to deposit the dielectric material.

22. The method of claim 16, wherein subsequent to step (v) and prior to step (vi), further comprises at least one of:
    (viii) performing densification on the combined substrate to degas the at least one layer of the dielectric material; and
    Inverting the second combined substrate.

23. The method of claim 22, wherein the densification is performed at about between 300° C. to 900° C. in a nitrogen environment.

24. The method of claim 22, wherein subsequent to step (viii), further comprises using chemical mechanical planarization to smoothen a portion of the dielectric material.

25. The method of claim 16, wherein bonding the third semiconductor substrate to the at least one layer of the dielectric material further includes annealing the second combined substrate at step (vi) to increase the bonding between the third semiconductor substrate and the at least one layer of the dielectric material.

26. The method of claim 25, wherein the annealing is performed using nitrogen at a temperature of about 300° C. and at atmosphere pressure.

27. The method of claim 16, wherein subsequent to step (i) and prior to step (ii), further comprises inverting the first combined substrate.

* * * * *